United States Patent
Jefferts et al.

(10) Patent No.: US 12,334,943 B2
(45) Date of Patent: Jun. 17, 2025

(54) ATOMIC CLOCK SYSTEM

(71) Applicant: NORTHROP GRUMMAN SYSTEMS CORPORATION, Falls Church, VA (US)

(72) Inventors: Steven Ryan Jefferts, Chatsworth, CA (US); Vyacheslav Lebedev, Redondo Beach, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 33 days.

(21) Appl. No.: 18/365,265

(22) Filed: Aug. 4, 2023

(65) Prior Publication Data

US 2024/0048145 A1  Feb. 8, 2024

Related U.S. Application Data

(60) Provisional application No. 63/395,981, filed on Aug. 8, 2022.

(51) Int. Cl.
*H03L 7/26* (2006.01)
*H01P 3/12* (2006.01)

(52) U.S. Cl.
CPC ............. *H03L 7/26* (2013.01); *H01P 3/122* (2013.01)

(58) Field of Classification Search
CPC ........................................ H03L 7/26
USPC ...................................... 331/94.1
See application file for complete search history.

(56) References Cited

U.S. PATENT DOCUMENTS

| | | | |
|---|---|---|---|
| 2016/0291549 A1 | 10/2016 | Herbsommer et al. | |
| 2019/0152773 A1* | 5/2019 | Herbsommer | B81C 1/00047 |
| 2020/0272107 A1 | 8/2020 | Herbsommer et al. | |
| 2022/0206441 A1* | 6/2022 | Yan | B81B 7/02 |

FOREIGN PATENT DOCUMENTS

| | | |
|---|---|---|
| CN | 113162621 A | 7/2021 |
| JP | 2007178273 A | 7/2007 |

OTHER PUBLICATIONS

Viennet, et al.: "Cavity Pulling in Passive Frequency Standards"; IEEE Trans. I&M 21(3) 204-209 (1972).

(Continued)

*Primary Examiner* — Joseph Chang
(74) *Attorney, Agent, or Firm* — Tarolli, Sundheim, Covell & Tummino LLP

(57) ABSTRACT

An atomic clock system includes a waveguide cavity that is sealed and comprises a gas enclosed therein. The waveguide cavity has a length that is an integer multiple of approximately one half-wavelength of a resonant frequency of the gas between two states. An oscillator system generates an RF signal through the waveguide cavity. The RF signal has a signal frequency that is approximately equal to the resonant frequency of the gas. A detection system measures a characteristic of the RF signal through the waveguide cavity to detect a maximum transition between the two states of the gas and to provide a feedback signal to the oscillator system to lock the signal frequency of the RF signal to the resonant frequency of the gas based on detecting the maximum transition. The detection system provides a frequency reference output signal based on the signal frequency of the RF signal.

18 Claims, 8 Drawing Sheets

(56) References Cited

OTHER PUBLICATIONS

Beck: "Cell coatings to minimize sample ($NH_3$ and $N_2H_4$) adsorption for low-level photoacoustic detection"; App. Optics 24 (12), 1761-1763 (1985).
Elelimy, et al.: "A Low Phase Noise Microwave Oscillator Based on a Planar Microstrip Spiral Resonator"; 2010-IEEE APS, Middle East Conference on Antennas and Propagation (MECAP), Cairo, Egypt, Oct. 20, 2010.
Bao, et al.: "A 25-GHz Ultra-Low Phase Noise InGaP/GaAs HBT VCO"; IEEE Micr. & Wirls. Comp. Lett., 15 (11) 751-755 (2005).
Buffa, et al.: "Collisional Shift of NH, Ammonia Inversion Spectrum"; J. Quant. Spec. Radiation. Transfer 52 (5), 673-675 (1994).
Zirath, et al.: "A x2 Coupled Colpitt VCO with Ultra Low Phase Noise"; in Proc. 26th IEEE Compound Semiconductor IC Symp., Oct. 2004, pp. 155-158.
Wineland, et al.: "Special Purpose Ammonia Frequency Standard—A Feasibility Study"; IEEE Trans. I&M 28, 122-132 (1979).
Wineland, et al.: "Results With the Special-Purpose Ammonia Frequency Standard*"; Proc. 1977 Freq. Cont. Symp. 562-578 (1977).
Wineland, et al.: "Special Purpose Atomic (Molecular) Standard*"; Proc. 1976 PTTI, 429-447 (1976).
Esterline, et al.: "Temperature Compensation of Crystal Oscillators Using an Artificial Neural Network"; Proc IEEE IFCS., 1-7 (2012).
Grop, et al.: "Flicker Noise of Microwave Power Detectors"; 2009 IEEE International Frequency Control Symposium Joint with the 22nd European Frequency and Time forum, Besancon, France, 2009, pp. 40-43, doi: 10.1109/FREQ.2009.5168138.
Vaittinen, et al.: "Adsorption of ammonia on treated stainless steel and polymer surfaces"; Appl. Phys. B, 115 (2), (2013).
NBSTECH: "The Atomic Clock"; Lyons, H., "The Atomic Clock: An Atomic Standard of Frequency and Time", N.B.S. Tech. Report 1320 (1949).
Wang, et al: "An on-chip fully electronic molecular clock based on sub-terahertz rotational spectroscopy"; Nature Electronics 1, 421-427 (2018).
Hati, et al.: "Vibration Sensitivity of Microwave Components*"; Proc. Joint EFTF FCS 2007, 541-546, (2007).
Coffer, et al.: "Cavity-Q Aging Observed via an Atomic-Candle Signal"; , IEEE Trans. UFFC. 51 (2), 2004.
Hauptmann, et al.: "23 GHz LNA With 1.5 V × 1 mA Supply in Low-fT SiGe Technology"; Mikon Jan. 4, 2008 (2008).
International Search Report and Written Opinion for corresponding PCT/US2023/029593, dated Nov. 28, 2023, pp. 1-10.

\* cited by examiner

ATOMIC CLOCK SYSTEM

RELATED APPLICATIONS

This application claims priority from U.S. Provisional Patent Application Ser. No. 63/395,981, filed 8 Aug. 2022, which is incorporated herein in its entirety.

TECHNICAL FIELD

The present disclosure relates generally to time reference systems, and specifically to an atomic clock system.

BACKGROUND

Atomic clocks can be implemented as extremely accurate and stable frequency references, such as for use in aerospace applications. As an example, atomic clocks can be used in bistatic radar systems, Global Navigation Satellite systems (GNSS), and other navigation and positioning systems, such as satellite systems. Atomic clocks can also be used in communications systems, such as cellular phone systems. Atomic clocks can typically be implemented by providing a signal (e.g., an optical or an RF signal) to an atomic material to provide excitation of the atomic material to a different excited state based on the very precise frequency of the signal required to do so. Examples of atomic clocks include coherent population trapping (CPT) atomic clocks, thermal beam atomic clocks, alkali vapor cell atomic clocks, and a variety of other atomic clocks.

SUMMARY

One embodiment includes an atomic clock system that includes a waveguide cavity that is sealed and comprises a gas enclosed therein. The waveguide cavity has a length that is an integer multiple of approximately one half-wavelength of a resonant frequency of the gas between two states. An oscillator system generates an RF signal through the waveguide cavity. The RF signal has a signal frequency that is approximately equal to the resonant frequency of the gas. A detection system measures a characteristic of the RF signal through the waveguide cavity to detect a maximum transition between the two states of the gas and to provide a feedback signal to the oscillator system to lock the signal frequency of the RF signal to the resonant frequency of the gas based on detecting the maximum transition. The detection system provides a frequency reference output signal based on the signal frequency of the RF signal.

Another embodiment includes a method for providing a stable frequency reference output signal. The method includes generating an RF signal having a signal frequency that is approximately equal to a resonant frequency of ammonia gas, and radiating the RF signal via a transmit antenna through a waveguide cavity that is sealed and comprises the ammonia gas enclosed therein. The waveguide cavity can have a length that is an integer multiple of approximately one half-wavelength of the resonant frequency of the ammonia gas between two states. The method also includes receiving the RF signal at a receive antenna opposite the transmit antenna through the waveguide cavity, and measuring a characteristic of the RF signal at the receive antenna to detect a maximum transition between the two states of the ammonia gas. The method also includes generating a feedback signal associated with a difference between the signal frequency and the resonant frequency of the gas based on detecting the maximum transition, and adjusting the signal frequency of the RF signal to be approximately equal to the resonant frequency in response to the feedback signal. The method further includes providing the stable frequency reference output signal based on the signal frequency of the RF signal.

Another embodiment includes an atomic clock system. The system includes a waveguide cavity that is sealed and comprises ammonia gas enclosed therein. The waveguide cavity can have a length that is an integer multiple of approximately one half-wavelength of a resonant frequency of the ammonia gas between two states. The system also includes an oscillator system configured to generate an RF dither signal between a first signal frequency and a second signal frequency and to provide the RF dither signal through the waveguide cavity via a transmit antenna. The RF dither signal can have a center frequency that is approximately equal to the resonant frequency of the ammonia gas. The system further includes a detection system configured to measure a characteristic of the RF dither signal received at a receive antenna opposite the transmit antenna through the waveguide cavity in each of the first and second signal frequencies to detect a maximum transition between the two states of the ammonia gas and to provide a feedback signal to the oscillator system to lock the center frequency of the RF signal to the resonant frequency of the ammonia gas based on detecting the maximum transition. The detection system can be configured to provide a frequency reference output signal based on the center frequency of the RF signal.

DETAILED DESCRIPTION

Figure 1:
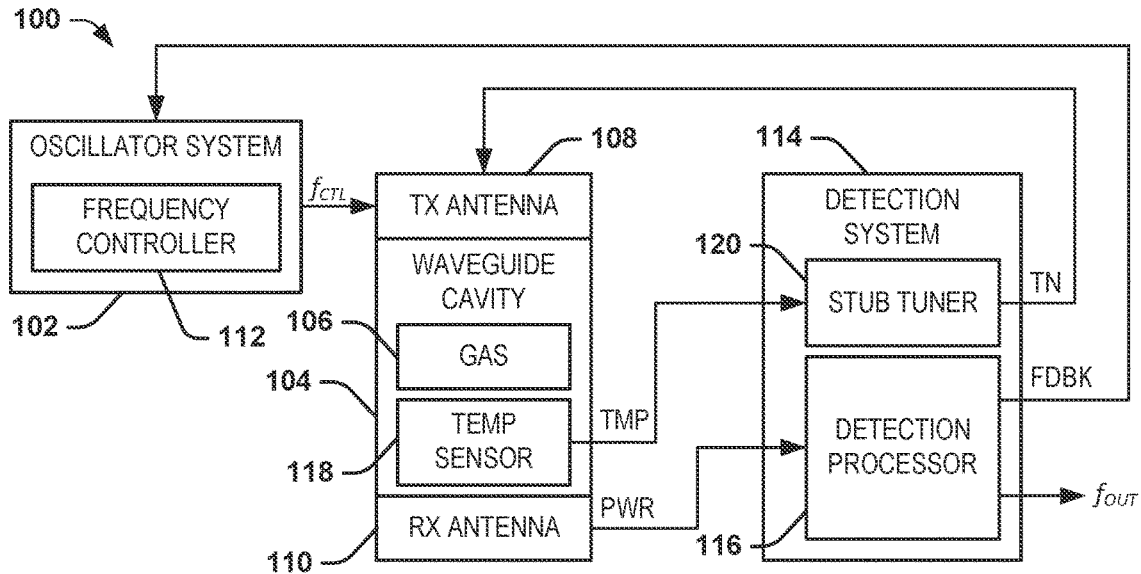
FIG. 1 illustrates an example of an atomic clock system.

The present disclosure relates generally to time reference systems, and specifically to an atomic clock system. The atomic clock system can be implemented to tune a frequency of a local oscillator, such as a crystal oscillator, that provides a stable frequency reference, thereby increasing the stability and accuracy of the local oscillator. The atomic clock system described herein can implement a radio frequency (RF) signal having a signal frequency that is provided approximately equal to a resonant frequency of a gas (e.g., ammonia gas, $NH_3$) to provide a state transition of a maximum population of the gas molecules. Because the resonant frequency of the gas can be very precise under a defined set of conditions, a stable frequency reference can be generated from the signal frequency of the RF signal by locking the signal frequency to be equal to the resonant frequency of the gas.

As an example, the atomic clock system can include a waveguide cavity that encloses the gas within and which is selected to have a length that is approximately equal to an integer multiple of one-half a wavelength of the resonant frequency of the gas (e.g., one-half the wavelength). The waveguide cavity includes a transmission antenna arranged at one end of the waveguide cavity and a receiver antenna arranged at an opposite end of the waveguide cavity to provide the RF signal through the waveguide cavity. As an example, the RF signal can be generated by an oscillator system that includes a frequency controller. The frequency controller can provide the RF signal as a dither signal that oscillates between a first frequency and a second frequency, such that a center frequency of the dither signal can correspond to the signal frequency that is locked to the resonant frequency of the gas. The received RF signal can be monitored by a detection system to determine a difference between the signal frequency and the resonant frequency, such as based on a power of the received RF signal. The detection system can thus generate a feedback signal that is provided to the oscillator system to adjust the signal frequency of the RF signal to be equal to the resonant frequency of the gas, thereby locking the signal frequency to the resonant frequency.

As described herein, the atomic clock system can be implemented to accommodate frequency instability caused by temperature changes, such as resulting from cavity pulling, and can accommodate variation in the pressure of the gas confined in the waveguide cavity. For example, the frequency controller of the oscillator system can periodically determine the resonant frequency of the waveguide cavity. The detection system can thus include a stub tuner that is configured to adjust the electrical length of the waveguide cavity in response to changes of the physical length of the waveguide cavity to match the electrical length of the waveguide cavity to the appropriate fraction of the resonant frequency of the gas. As another example, the detection system can include a detection processor that is configured to measure a pressure of the gas enclosed within the waveguide cavity based on changing the frequency offset from the center frequency of the dither signal. Therefore, in response to changes in the pressure of the gas, and thus changes to the resonant frequency of the gas, the detection processor can adjust the stable frequency reference to accommodate the change to the resonant frequency of the gas.

FIG. 1 illustrates an example of an atomic clock system 100. The atomic clock system 100 can be implemented in any of a variety of applications that require a highly stable frequency reference, such as in an inertial navigation system (INS) of an aerospace vehicle. As described in greater detail herein, the atomic clock system 100 can be implemented to adjust a frequency of an oscillator system 102, such as a local oscillator operating therein, to provide a stable frequency reference output signal $f_{OUT}$. As an example, the atomic clock system 100 can be fabricated as an integrated atomic clock system, such as based on any of a variety of integrated circuit (IC) fabrication techniques.

The atomic clock system 100 includes a waveguide cavity 104 that includes a gas 106 enclosed therein. As an example, the gas 106 can be, but is not limited to, ammonia gas ($NH_3$). In the example of FIG. 1, the oscillator system 102 is configured to provide a radio frequency (RF) signal $f_{CTL}$ to a transmit antenna ("TX ANTENNA") 108 to propagate the RF signal $f_{CTL}$ through the waveguide cavity 104, and thus through the gas 106. The RF signal $f_{CTL}$ can thus be received via a receive antenna 110 on an opposite end of the waveguide cavity 104 relative to the transmit antenna 108. The oscillator system 102 includes a frequency controller 112 that is configured to control the signal frequency of the RF signal $f_{CTL}$. As described herein, the atomic clock system 100 can operate to lock the signal frequency of the RF signal $f_{CTL}$ to be approximately equal to a resonant frequency of the gas, and thus a frequency at which a greatest population of the molecules of the gas exhibit a transition between two energy states. As described in greater detail herein, the signal frequency of the RF signal $f_{CTL}$ can refer to a center frequency of a dither signal that includes offset frequencies, such that the signal frequency of the RF signal $f_{CTL}$ can be a time-averaged frequency that is approximately equal to the resonant frequency of the gas 106. By locking the signal frequency of the RF signal $f_{CTL}$ to the resonant frequency, the atomic clock system 100 can provide the stable frequency reference $f_{OUT}$ based on the signal frequency of the RF signal $f_{CTL}$, as described in greater detail herein.

As an example, the waveguide cavity 104 can have a length that is an integer N multiple of one-half the wavelength of the resonant frequency of the gas 106. For example, the integer N can be equal to one, such that the length of the waveguide cavity 104 is one-half the wavelength of the resonant frequency of the gas 106. In the example of the gas 106 being ammonia gas, the resonant frequency under defined conditions, such as a vapor pressure of $10^{-3}$ Torr, is approximately 22.8 GHz. Therefore, the waveguide cavity 104 can have a length of approximately 34.8 millimeters. However, the integer multiple N is not limited to being one, but other multiples can be implemented instead. Therefore, the waveguide cavity 104 can exhibit a resonant frequency that is associated with resonant frequency of the gas 106.

Figure 2:
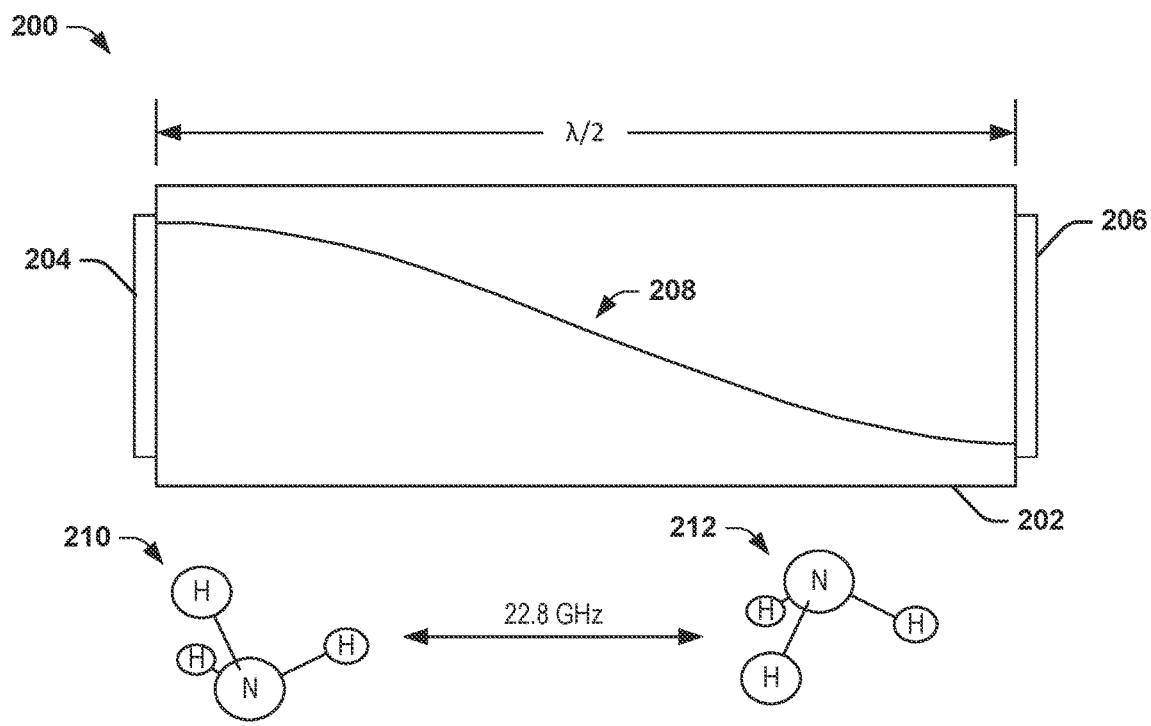
FIG. 2 illustrates an example diagram of a waveguide cavity.

FIG. 2 illustrates an example diagram 200 of a waveguide cavity 202. The waveguide cavity 202 can correspond to the waveguide cavity 104 in the example of FIG. 1. The waveguide cavity 202 is demonstrated as including a transmit antenna 204 at a first end of the waveguide cavity 202 and a receive antenna 206 at a second end of the waveguide cavity 202 opposite the first end. Therefore, the RF signal, demonstrated at 208 and corresponding to the RF signal $f_{CTL}$ in the example of FIG. 1, can be provided to the transmit antenna 204 (e.g., from the oscillator system 102) to propagate through the waveguide cavity 202 to be received by the receive antenna 206. As described above in the example of FIG. 1, the waveguide cavity 202 can be filled with a gas, demonstrated in the example of FIG. 2 as ammonia gas. A molecule of the ammonia gas is demonstrated in the example of FIG. 2 at 210 in a first state. Therefore, the RF signal 208 is provided through the volume of ammonia gas.

The waveguide cavity 202 is demonstrated as having a length of $N*\lambda/2$, where N is an integer and equal to one (N=1) in the example of FIG. 2, and where $\lambda$ is a wavelength of the resonant frequency of the ammonia gas. Therefore, the RF signal 208 is demonstrated as having antinodes at each of the transmit antenna 204 and the receive antenna 206, such as to transmit the RF signal 208 from the transmit antenna 204 to the receive antenna 206 to provide a greatest signal-to-noise ratio (SNR). Therefore, the RF signal 208 having a signal frequency that is approximately equal to the resonant frequency of the ammonia gas, demonstrated in the example of FIG. 2 as approximately 22.8 GHz, can result in a greatest population of the ammonia gas experiencing an inversion transition between the first state at 210 to a second state at 212 in which the nitrogen atom is inverted relative to a plane of the hydrogen atoms. The inversion transition of the ammonia gas atoms between the states 210 and 212 consumes power from the RF signal 208. Therefore, as one example, the measured power of the RF signal 208 received at the receive antenna 206 can be indicative of the population of the ammonia gas that exhibits the inversion transition, and can thus indicate the signal frequency of the RF signal 208.

Figure 3:
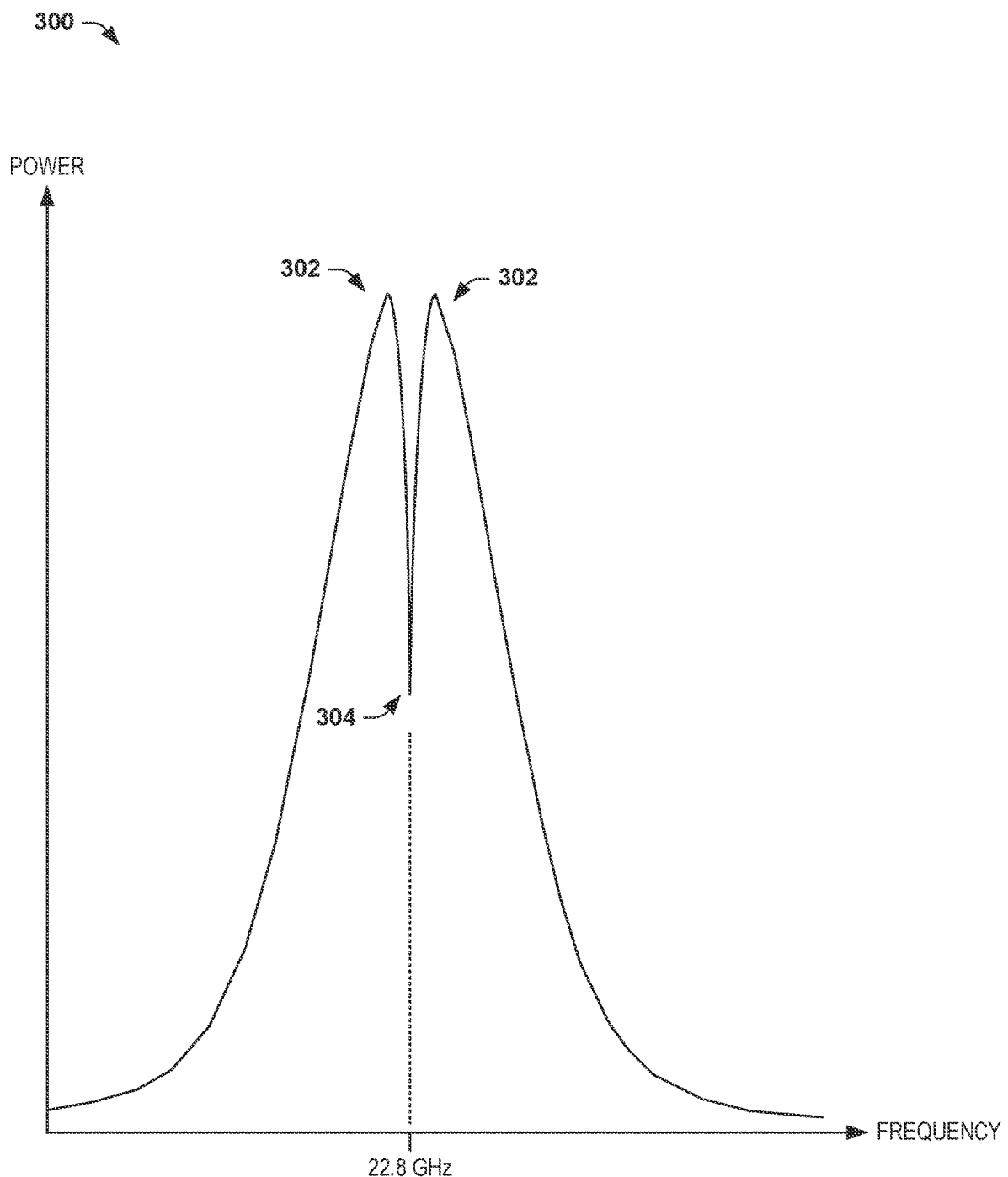
FIG. 3 illustrates an example diagram of a power absorption frequency spectrum.

FIG. 3 illustrates an example diagram 300 of a power absorption frequency spectrum. The power absorption frequency spectrum demonstrates the power of the RF signal 208 through the waveguide cavity 202, as measured at the receive antenna 206, plotted as a function of signal frequency of the RF signal 208. As demonstrated in the example of FIG. 3, the diagram 300 demonstrates a pair of low absorption peaks 302 at which the measured power of the RF signal 208 is at a maximum, and is thus stimulating the inversion transition of the ammonia gas on the least population of the ammonia gas. The diagram 300 also demonstrates an inverted peak 304 located at approximately 22.8 GHz. The inverted peak 304 is therefore located at the resonant frequency of the ammonia gas, and thus demonstrates the greatest absorption of power of the RF signal 208 to provide the inversion transition of the ammonia gas between the two states 210 and 212 on the greatest population of the ammonia gas.

The low absorption peaks 302 and the inverted peak 304 can be symmetric about the inverted peak 304, and thus about the resonant frequency of the ammonia gas. The power absorption frequency spectrum can be a priori known from experimentation, such that the symmetry of the power absorption frequency spectrum and the relationship between the measured power of the RF signal $f_{CTL}$ and the frequency can be identified by the detection processor 116. As described in greater detail herein, the atomic clock system 100 thus operates to lock the signal frequency of the RF signal $f_{CTL}$ to the resonant frequency of the ammonia gas to provide the stable frequency reference $f_{OUT}$ based on the signal frequency of the RF signal 208.

Referring back to the example of FIG. 1, the atomic clock system 100 includes a detection system 114 that is configured to measure the RF signal $f_{CTL}$, having propagated through the gas 106 and demonstrated in the example of FIG. 1 as a signal PWR, at the receive antenna 110. The detection system 114 includes a detection processor 116 that is configured to monitor the RF signal $f_{CTL}$ and to compare the signal frequency of the RF signal $f_{CTL}$ with the resonant frequency of the gas 106. As an example, the detection processor 116 can be configured to monitor the power of the RF signal $f_{CTL}$, such as to detect the power absorption of the RF signal $f_{CTL}$ based on the inversion transition of the ammonia gas, as described above in the example of FIG. 3. In the example of FIG. 1, the detection processor 116 is configured to generate a feedback signal FDBK that is indicative of a difference between the signal frequency of the RF signal $f_{CTL}$ and the resonant frequency of the gas 106. The feedback signal FDBK is provided to the oscillator system 102, such that the frequency controller 112 can provide an adjustment to the signal frequency of the RF signal $f_{CTL}$ corresponding to the difference. Therefore, in this manner, the signal frequency of the RF signal $f_{CTL}$ can be locked to the highly stable resonant frequency of the gas 106.

The above example describes an example in which the detection processor 116 monitors the power of the RF signal $f_{CTL}$ to compare the signal frequency of the RF signal $f_{CTL}$ with the resonant frequency of the gas 106. However, other characteristics of the RF signal $f_{CTL}$ can be monitored for detection of the inversion transition of the ammonia gas. For example, the detection processor 116 can be configured to monitor a phase of the RF signal $f_{CTL}$ to lock the signal frequency of the RF signal $f_{CTL}$ to the resonant frequency of the ammonia gas based on detecting the maximum inversion transition, similar to as described above.

In the example of FIG. 1, the detection processor 116 is also configured to generate the stable frequency reference output signal $f_{OUT}$. As described above, the stable frequency reference output signal $f_{OUT}$ can be generated based on the signal frequency of the RF signal $f_{CTL}$. Because the signal frequency of the RF signal $f_{CTL}$ is locked to the highly stable resonant frequency of the gas 106, the stable frequency output signal $f_{OUT}$ can likewise be provided as having a highly stable and accurate frequency. As an example, the detection processor 116 can be configured to downsample the signal frequency of the RF signal $f_{CTL}$ to provide the stable frequency output signal $f_{OUT}$ as having a more manageable frequency, such as in the megahertz range (e.g., 5 MHz). As described in greater detail herein, the atomic clock system 100 can mitigate external perturbations that might otherwise affect the stable frequency output signal $f_{OUT}$, such as resulting from variations in temperature of the waveguide cavity 104 and/or variations in pressure of the gas 106. Accordingly, the atomic clock system 100 can exhibit superior accuracy and stability relative to conventional atomic clock systems that likewise provide a frequency reference based on the state transition of a gas.

Figure 4:
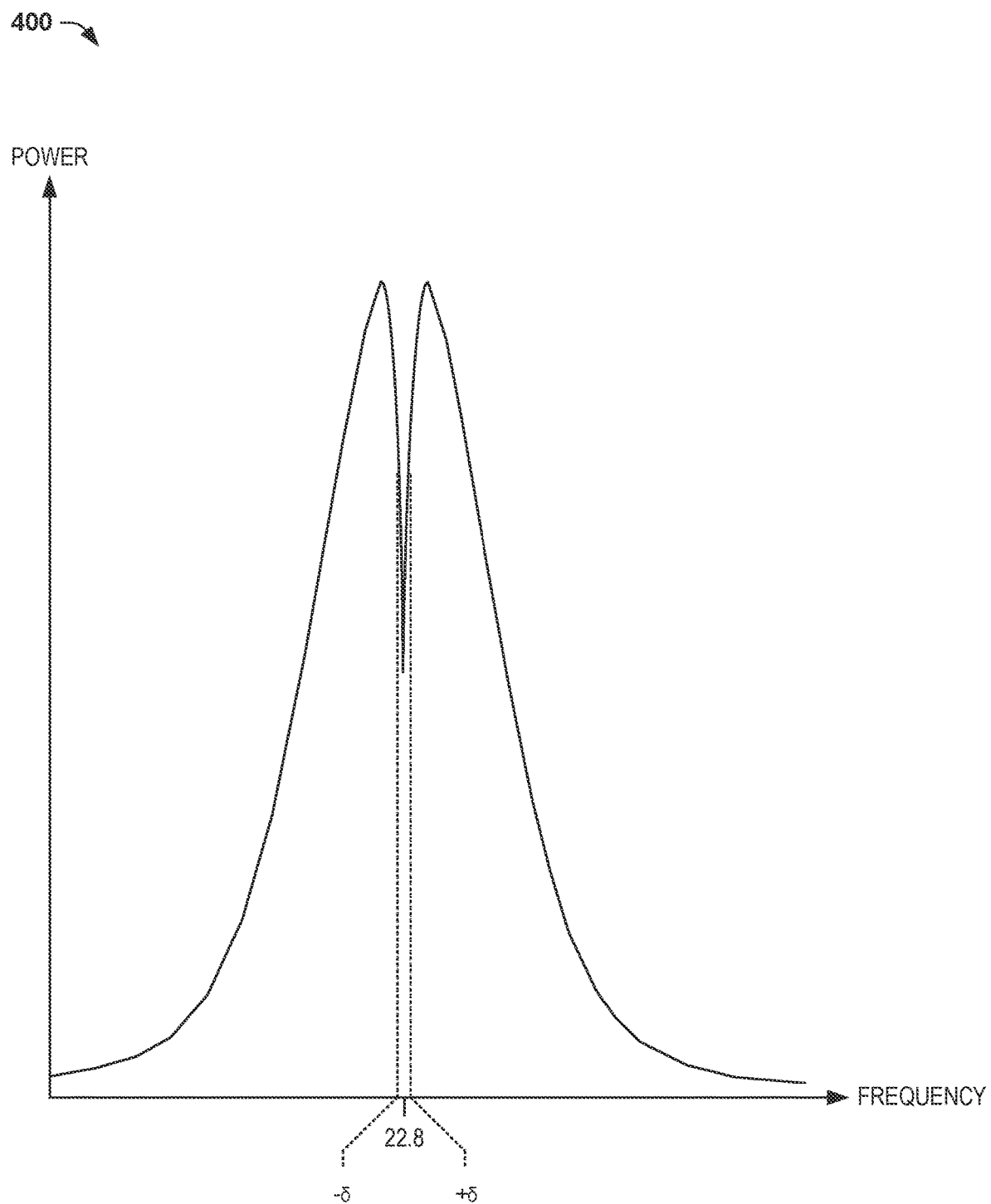
FIG. 4 illustrates another example diagram of a power absorption frequency spectrum.

As described above, the RF signal $f_{CTL}$ can be provided from the oscillator system 102 as a dither signal that includes offset frequencies. FIG. 4 illustrates another example diagram 400 of a power absorption frequency spectrum. The diagram 400 demonstrates the same power absorption frequency spectrum as demonstrated in the diagram 300 in the example of FIG. 3. Therefore, reference is to be made to the examples of FIGS. 1 and 3 in the following description of the example of FIG. 4.

In the example of FIG. 4, the RF signal $f_{CTL}$ generated by the oscillator system 102 is demonstrated as a dither signal. For example, the frequency controller 112 can be configured to provide the RF signal $f_{CTL}$ as having an offset frequency δ about a center frequency. The center frequency can correspond to the signal frequency of the RF signal $f_{CTL}$ that is locked to the resonant frequency of the gas 106. The dither signal corresponding to the RF signal $f_{CTL}$ can have a time-averaged frequency that is equal to the center frequency. During a first time interval, the frequency controller 112 can provide the RF signal $f_{CTL}$ as having a first frequency +δ, such that the offset frequency δ is added to the center frequency that is locked to the resonant frequency of the gas 106. During a second time interval that is approximately equal to the first time interval, the frequency controller 112 can provide the RF signal $f_{CTL}$ as having a second frequency −δ, such that the offset frequency δ is subtracted from the center frequency that is locked to the resonant frequency of the gas 106. The offset frequency δ can be selected as a small offset to identify the slope of each side of the inverted peak 304 of the power absorption frequency spectrum. Therefore, in the example of FIG. 4, the first and second frequencies +δ and −δ can each be associated with a portion of the power absorption frequency spectrum that is approximately half the height of the inverted peak 304.

Figure 5:
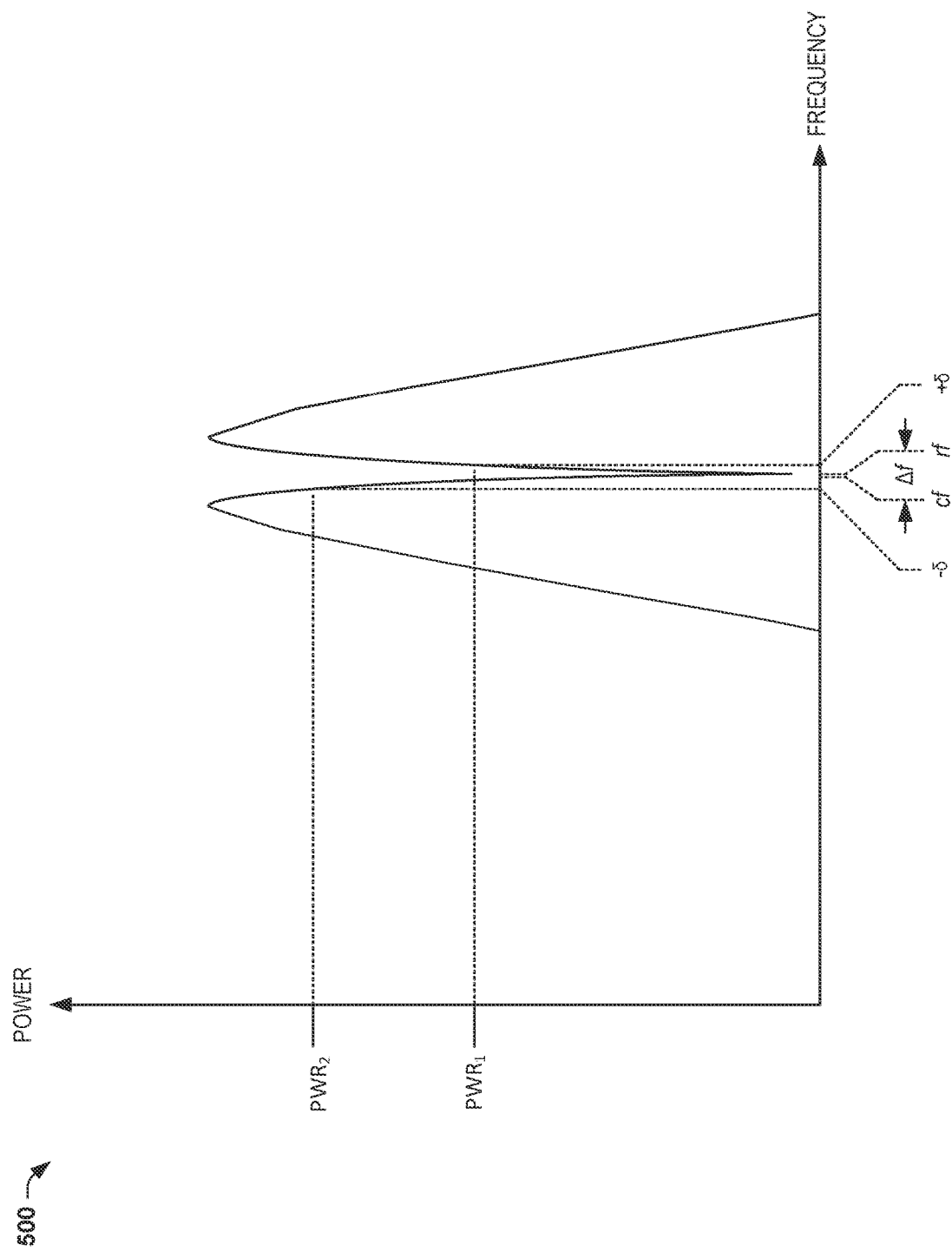
FIG. 5 illustrates another example diagram of a power absorption frequency spectrum.

FIG. 5 illustrates another example diagram 500 of a power absorption frequency spectrum. The diagram 500 demonstrates a magnified portion of the same power absorption frequency spectrum as demonstrated in the diagrams 300 and 400 in the respective examples of FIGS. 3 and 4. Therefore, reference is to be made to the examples of FIGS. 1, 3, and 4 in the following description of the example of FIG. 5.

The magnification of the power absorption frequency spectrum is such that only the peaks 302 and the inverted peak 304 are demonstrated in the example of FIG. 5. As described above, the detection system 114 is configured to monitor the power of the RF signal $f_{CTL}$ having propagated through the gas 106 in the waveguide cavity 104, such that the detection processor 116 can determine the signal frequency of the RF signal $f_{CTL}$ relative to the resonant frequency of the gas 106. The detection processor 116 can thus generate the feedback signal FDBK to indicate the difference between the signal frequency of the RF signal $f_{CTL}$ relative to the resonant frequency of the gas 106 to adjust the signal frequency by the difference, thereby locking the signal frequency to the resonant frequency of the gas 106.

The example of FIG. 5 demonstrates an example in which the center frequency of the RF signal $f_{CTL}$, demonstrated as a frequency cf, has shifted relative to the resonant frequency of the gas, demonstrated as a frequency rf. In the example of FIG. 5, the center frequency cf is demonstrated as being slightly less than the resonant frequency rf by a frequency difference Δf. Similar to as described above in the example of FIG. 4, the frequency controller 112 provides the RF signal $f_{CTL}$ as a dither signal between the frequencies +δ and −δ in each of two respective equal time intervals. During the first time interval, when the dither signal has the frequency +δ, and is thus greater than the center frequency cf by the offset frequency δ, the detection system 114 detects a power amplitude of the received RF signal $f_{CTL}$ of $PWR_1$. During the second time interval, when the dither signal has the frequency −δ, and is thus less than the center frequency cf by the offset frequency δ, the detection system 114 detects a power amplitude of the received RF signal $f_{CTL}$ of $PWR_2$.

Based on the symmetry of the power absorption frequency spectrum, the difference between the measured power amplitudes $PWR_1$ and $PWR_2$ is thus indicative of the frequency difference Δf between the center frequency cf and the resonant frequency rf. The detection processor 116 can thus identify the frequency difference Δf based on the difference between the measured power amplitudes $PWR_1$ and $PWR_2$. The detection processor 116 can thus generate the feedback signal FDBK to indicate the frequency difference Δf. Therefore, in response to the feedback signal FDBK, the frequency controller 112 can adjust the center frequency cf of the RF signal $f_{CTL}$ by the frequency difference Δf. In the example of FIG. 5, the frequency controller 112 can increase the center frequency cf of the RF signal $f_{CTL}$ by the frequency difference Δf to provide the center frequency cf of the RF signal $f_{CTL}$ to be approximately equal to the resonant frequency rf. The proceeding measurement of the power of the RF signal $f_{CTL}$ received by the receive antenna 110 should thus result in a power difference between the measured powers $PWR_1$ and $PWR_2$ of approximately zero. Accordingly, the atomic clock system 100 can lock the signal frequency (e.g., center frequency cf) of the RF signal $f_{CTL}$ to the resonant frequency rf of the ammonia gas 106.

Referring back to the example of FIG. 1, as described above, the waveguide cavity 104 can be fabricated to have a length that is approximately equal to an integer multiple of the wavelength (e.g., one-half the wavelength) of the resonant frequency of the gas 106. Such a dimension of the waveguide cavity 104 facilitates use of a low-order cavity mode $TE_{102}$. Such a low-order cavity mode provides several benefits compared to the use of higher order modes, such as implemented in conventional atomic clock systems. The benefits of using the low-order cavity mode can include Dicke confinement, reduced mode-pulling, and higher temperature compensation fidelity. Because the gas 106 is confined in the waveguide cavity 104 at a distance comparable to the transition wavelength of the resonant frequency of the gas 106, Dicke confinement can result in Doppler narrowing of the transition of the gas 106. Also, the relatively large frequency separation between the adjoining $TE_{101}$ and $TE_{103}$ modes can suppress line-pulling of the transition of the gas 106 due to adjacent modes. Furthermore, as described in greater detail below, the increased free spectral range (FSR) of the low-order mode for the waveguide cavity 104 provides for a passive temperature compensation scheme to accommodate cavity pulling more easily than for a higher-order cavity.

While the length of the waveguide cavity 104 provides the above described benefits, variations in temperature can change the physical length of the waveguide cavity 104. Therefore, the physical length of the waveguide cavity 104 can thus become greater than or less than the integer multiple of the wavelength of the resonant frequency of the gas 106. However, as described below, the atomic clock system 100 can be configured to accommodate variations in the physical length of the waveguide cavity 104 to maintain stability of the locking of the signal frequency of the RF signal $f_{CTL}$ to the resonant frequency of the gas 106, and thus the stability of the frequency reference output signal $f_{OUT}$.

As a first example, in the example of FIG. 1, the waveguide cavity 104 includes a temperature sensor ("TEMP SENSOR") 118 that is configured to monitor a temperature of the waveguide cavity 104, and the detection system 114 includes a stub tuner 120. The temperature sensor 118 is demonstrated as providing an indication of the temperature of the waveguide cavity 104, demonstrated as a signal TMP, to the stub tuner 120. As an example, the relationship between the temperature of the waveguide cavity 104 and the physical length of the waveguide cavity 104 can be modeled and/or tested. Therefore, the detection processor 116 and/or the stub tuner 120 can be configured to identify the variations in the physical length of the waveguide cavity 104 based on the measured temperature TMP. In response to a change in temperature of the waveguide cavity 104, as indicated by the signal TMP, the stub tuner 120 can provide a signal TN to provide reactive loading to the transmit antenna 108. As an example, the reactive loading can provide an adjustment to the capacitance and/or inductance of the transmit antenna 108 to induce a phase-shift of the RF signal $f_{CTL}$ that is transmitted by the transmit antenna 108. As a result, the reactive loading that is provided to the transmit antenna 108 provides an adjustment to an electrical length of the waveguide cavity 104. The change in electrical length of the waveguide cavity 104 can thus compensate for the change in the physical length of the waveguide cavity 104. Accordingly, the waveguide cavity 104 can compensate for temperature-induced cavity pulling based on the temperature sensor 118 and the stub tuner 120.

As a second example, the temperature sensor 118 can be omitted from the waveguide cavity 104, and a passive temperature compensation scheme can be implemented based on periodic frequency sweeping of the RF signal $f_{CTL}$. The passive temperature compensation scheme is demonstrated in the example of FIG. 6.

Figure 6:
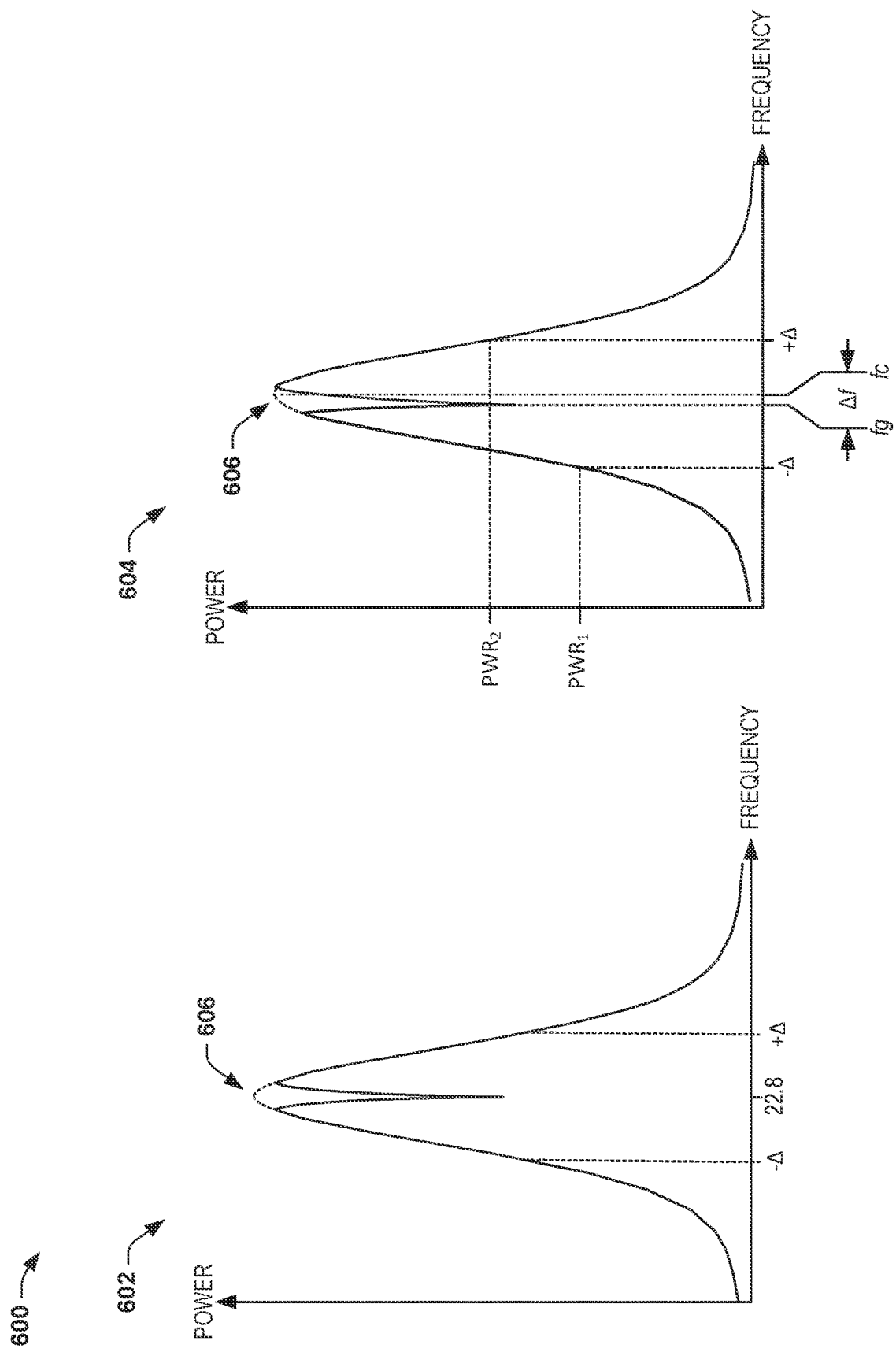
FIG. 6 illustrates another example diagram of a power absorption frequency spectrum.

FIG. 6 illustrates another example diagram 600 of a power absorption frequency spectrum. The diagram 600 demonstrates a first power absorption frequency spectrum 602 and a second power absorption frequency spectrum 604. The first power absorption frequency spectrum 602 is demonstrated as the same power absorption frequency spectrum as demonstrated in the diagram 300 in the example of FIG. 3. Therefore, reference is to be made to the examples of FIGS. 1 and 3 in the following description of the example of FIG. 6.

The first power absorption frequency spectrum 602 can correspond to steady state operation of the atomic clock system 100 in which the resonant frequency of the waveguide cavity 104 is approximately equal to the resonant frequency of the gas 106. In the example of FIG. 6, the resonant frequency of the waveguide cavity 104 is demonstrated by a virtual peak 606 that is centered between the low absorption peaks 302. Thus, the virtual peak 606 is approximately aligned with the inverted peak 304 to indicate that the resonant frequencies of the waveguide cavity 104 and the gas 106 are approximately equal. Therefore, the first power absorption frequency spectrum 602 is demonstrated as symmetric about the inverted peak 304, as described above. By providing for approximately equal resonant frequencies of the waveguide cavity 104 and the gas 106, the low-order mode of propagation of the RF signal $f_{CTL}$ can be implemented for accurate generation of the stable frequency reference output signal $f_{OUT}$.

As described above, the frequency controller 112 can be configured to periodically sweep the frequency of the RF signal $f_{CTL}$ in order to determine the resonant frequency of the waveguide cavity 104. The periodic sweep of the frequency is demonstrated as a sweep of the frequency between a first frequency $-\Delta$ and a second frequency $+\Delta$. As an example, the frequencies $-\Delta$ and $+\Delta$ can correspond to large offset frequencies with respect to the center frequency of the RF signal $f_{CTL}$ and/or the resonant frequency of the gas 106. The first frequency $-\Delta$ corresponds to approximately halfway up the ascending portion of the power absorption frequency spectrum that is less than the first low absorption peak 302, and the second frequency $+\Delta$ corresponds to approximately halfway down the descending portion of the power absorption frequency spectrum that is greater than the second low absorption peak 302. Therefore, the periodic sweep of the frequency between the first frequency $-\Delta$ and the second frequency $+\Delta$ is a broad frequency band across the power absorption frequency spectrum with frequency boundaries at approximately equal power portions across the first power absorption frequency spectrum 602.

The resonant frequency of the waveguide cavity 104 can change based on variations in temperature, as described above. Therefore, by determining the resonant frequency of the waveguide cavity 104, the temperature can easily be compensated for by adjusting the resonant frequency of the waveguide cavity 104 to be approximately equal to the resonant frequency of the gas 106. The second power absorption frequency spectrum 604 demonstrates a shift of the resonant frequency of the waveguide cavity 104, demonstrated as a frequency fc, relative to the resonant frequency of the gas 106, demonstrated as a frequency fg. In the example of FIG. 6, the resonant frequency fg of the gas 106 is demonstrated as being slightly less than the resonant frequency fc of the waveguide cavity 104 by a frequency difference $\Delta f$. The virtual peak 606 is therefore demonstrated as shifted relative to the inverted peak 304, resulting in an asymmetry of the power absorption frequency spectrum.

When the frequency controller 112 performs a frequency sweep, the detection system 114 can detect a power amplitude of the received RF signal $f_{CTL}$ of $PWR_1$ at the first frequency $-\Delta$ and can detect a power amplitude of the received RF signal $f_{CTL}$ of $PWR_2$ at the second frequency $+\Delta$. Based on the asymmetry of the second power absorption frequency spectrum 604, the difference between the measured power amplitudes $PWR_1$ and $PWR_2$ is thus indicative of the frequency difference $\Delta f$ between the resonant frequency fg of the gas 106 and the resonant frequency fc of the waveguide cavity 104. The detection processor 116 can thus identify the frequency difference $\Delta f$ based on the difference between the measured power amplitudes $PWR_1$ and $PWR_2$. The detection processor 116 can thus provide instruction to the stub tuner 120 to change the electrical length of the waveguide cavity 104, similar to as described above in the first example of temperature compensation.

For example, the stub tuner 120 can provide the signal TN to provide the reactive loading to the transmit antenna 108 to induce a phase-shift of the RF signal $f_{CTL}$ that is transmitted by the transmit antenna 108. As a result, the reactive loading that is provided to the transmit antenna 108 provides an adjustment to the electrical length of the waveguide cavity 104. The change in electrical length of the waveguide cavity 104 can thus compensate for the change in the physical length of the waveguide cavity 104 that results in the offset of the resonant frequency fg of the gas 106 and the resonant frequency fc of the waveguide cavity 104. The change in the electrical length of the waveguide cavity 104 can thus result in approximate alignment of the resonant frequency fc of the waveguide cavity 104 with the resonant frequency fg of the gas 106. Accordingly, the waveguide cavity 104 can compensate for temperature-induced cavity pulling based on performing periodic frequency sweeps between the first frequency $-\Delta$ and the second frequency $+\Delta$ and implementing the stub tuner 120 to change the electrical length of the waveguide cavity 104.

In addition to accommodating changes to frequency, the atomic clock system 100 can also accommodate changes to the pressure of the gas 106 in the waveguide cavity 104. For example, variations in temperature can provide deleterious effects not only on the resonant frequency of the waveguide cavity 104, but also on the pressure of the gas 106 enclosed therein. The pressure of the gas 106 can affect the resonant frequency of the gas 106, such that variations of the pressure of the gas 106 can result in locking the signal frequency to an inaccurate frequency value. As a result, the stable frequency reference output signal $f_{OUT}$ could include errors absent pressure compensation.

Figure 7:
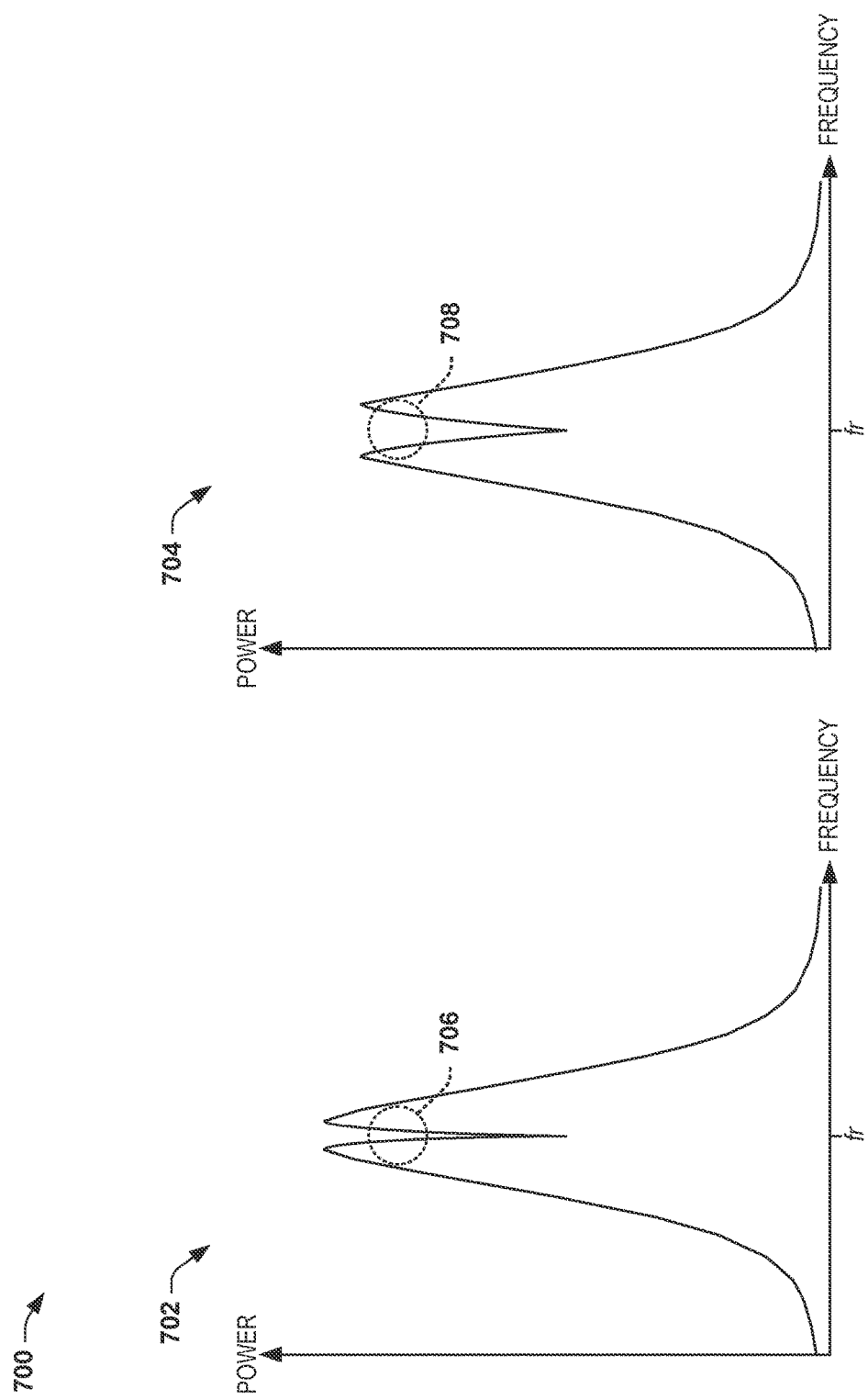
FIG. 7 illustrates another example diagram of a power absorption frequency spectrum.

FIG. 7 illustrates another example diagram 700 of a power absorption frequency spectrum. The diagram 700 demonstrates a first power absorption frequency spectrum 702 and a second power absorption frequency spectrum 704. The first power absorption frequency spectrum 702 is demonstrated as the same power absorption frequency spectrum as demonstrated in the diagram 300 in the example of FIG. 3. Therefore, reference is to be made to the examples of FIGS. 1 and 3 in the following description of the example of FIG. 7.

The first power absorption frequency spectrum 702 can correspond to steady state operation of the atomic clock system 100 at a first pressure of the ammonia gas in the waveguide cavity 104. Changes in the pressure of the ammonia gas can result in a change in separation of the low absorption peaks 302 of the power absorption frequency spectrum. Such changes in the separation of peaks can result in a change in the slope of the inverted peak 304. In the example of FIG. 7, the second power absorption frequency spectrum 704 can correspond to steady state operation of the atomic clock system 100 at a second pressure of the ammonia gas in the waveguide cavity 104, with the second pressure being different from the first pressure.

The pressure of the ammonia gas has a direct correlation to the resonant frequency of the ammonia gas enclosed in the volume of the waveguide cavity 104. Therefore, the inverted peaks of the first and second power absorption frequency spectrums 702 and 704 are demonstrated at a resonant frequency of fr corresponding to the maximum population of the molecules of the ammonia gas that exhibit the inversion transition between the first and second states 210 and 212. As described above, for a pressure of approximately $10^{-3}$ Torr, the resonant frequency fr is approximately 22.8 GHz. However, in response to changes in the pressure, the resonant frequency fr can drift. Absent knowledge of the change in the resonant frequency fr, the detection processor 116 would therefore lock the signal frequency of the RF signal $f_{CTL}$ to the changed resonant frequency, resulting in a frequency error of the stable frequency reference output signal $f_{OUT}$. However, as described in the example of FIG. 8, the detection processor 116 can detect and compensate for variations in the pressure of the gas 106 in the waveguide cavity 104.

Figure 8:
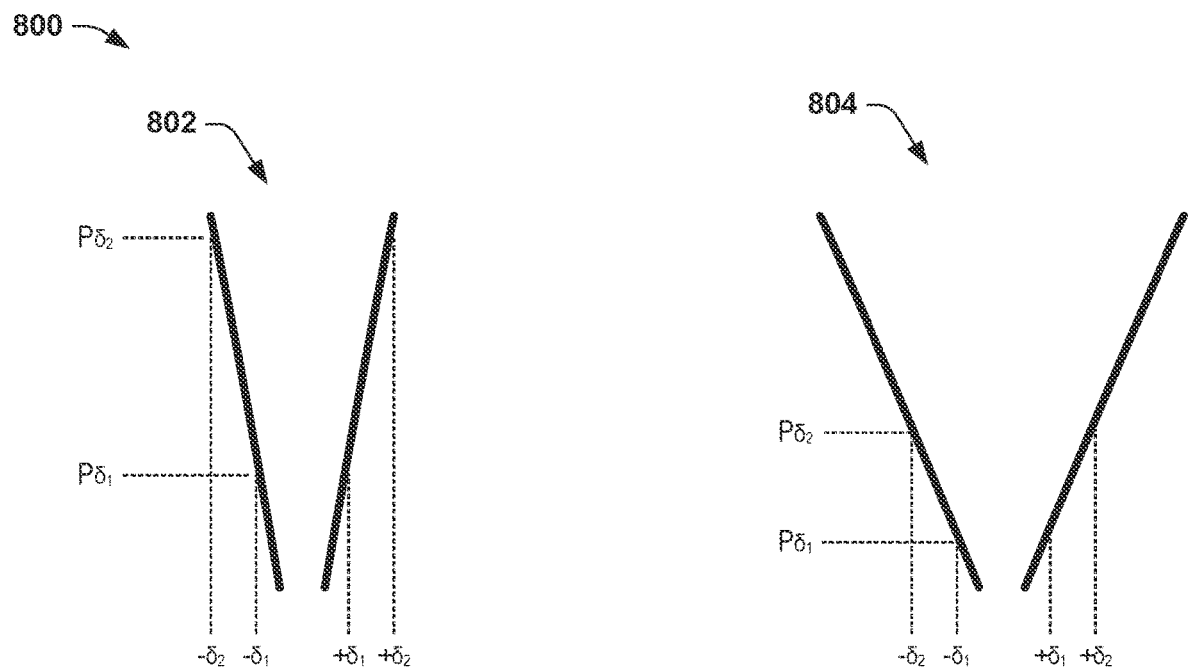
FIG. 8 illustrates another example diagram of a power absorption frequency spectrum.

FIG. 8 illustrates another example diagram 800 of a power absorption frequency spectrum. The diagram 800 includes a first power absorption frequency spectrum 802 that corresponds to a magnified region 706 of the first power absorption frequency spectrum 702 in the example of FIG. 7. The diagram 800 also includes a second power absorption frequency spectrum 804 that corresponds to a magnified region 708 of the second power absorption frequency spectrum 704 in the example of FIG. 7. Therefore, reference is to be made to the examples of FIGS. 1, 3, and 7 in the following description of the example of FIG. 8.

As described above in the examples of FIGS. 4 and 5, the RF signal $f_{CTL}$ generated by the oscillator system 102 can be provided as a dither signal in which an offset frequency δ is added and subtracted from a center frequency. To detect the pressure of the gas 106 in the waveguide cavity 104, the detection processor 116 can measure the slope of the inverted peak 304 based on the dither signal. As an example, the frequency controller 112 can provide the dither signal by adding and subtracting a first offset frequency $δ_1$ from the center frequency during a first time duration, and can provide the dither signal by adding and subtracting a second offset frequency $δ_2$ from the center frequency during a second time duration, where the second offset frequency $δ_2$ is greater than the first offset frequency $δ_1$.

As described above in the examples of FIGS. 4 and 5, the detection processor 116 can lock the center frequency to the resonant frequency based on measuring the power PWR of the received RF signal $f_{CTL}$ during each of the time intervals of the two dither frequencies +δ7 and −δ. During steady state operation, each iteration of measurement can result in a time-averaged difference of the power measurements to be approximately zero, thus indicating that the center frequency is approximately equal to the resonant frequency of the gas 106. The power measurements $PWR_1$ and $PWR_2$ are based on power absorption on each side of the inverted peak 304 at each of the dither frequencies +δ and −δ. By adjusting the dither frequencies from +$δ_1$ and −$δ_1$ to +$δ_2$ and −$δ_2$, the power measurements $PWR_1$ and $PWR_2$ are different based on the portion of the inverted peak that are aligned with the dither frequencies +$δ_2$ and −$δ_2$.

In the example of FIG. 8, in each of the first and second power absorption frequency spectrums 802 and 804, the center frequency is the same for the dither frequencies from +$δ_1$ and −$δ_1$ and +$δ_2$ and −$δ_2$, and is approximately equal to the resonant frequency of the gas 106. In the first power absorption frequency spectrum 802, the dither frequencies +$δ_1$ and −$δ_1$ provided during the first time duration each correspond to a portion of the power absorption frequency spectrum having a power $Pδ_1$ (e.g., $PWR_1=PWR_2=Pδ_1$). Therefore, during the first time duration, the dither frequency is provided as +$δ_1$ and −$δ_1$ to measure the respective powers $PWR_1$ and $PWR_2$ about the power $Pδ_1$. During the second time duration, the dither frequencies +$δ_2$ and −$δ_2$ each correspond to a portion of the power absorption frequency spectrum having a power $Pδ_2$ (e.g., $PWR_1=PWR_2=Pδ_2$). Therefore, during the second time duration, the dither frequency is provided as +$δ_2$ and −$δ_2$ to measure the respective powers $PWR_1$ and $PWR_2$ about the power $Pδ_2$.

Based on the slope of the inverted peak 304 of the first power absorption frequency spectrum 802, the power $Pδ_2$ is greater than the power $Pδ_1$. The difference between the powers $Pδ_1$ and $Pδ_2$ and the difference between the relative offset frequencies $δ_1$ and $δ_2$ can be determinative of the slope of the inverted peak 304. Therefore, the detection processor 116 can calculate the pressure of the gas 106 in the waveguide cavity 104 based on the known relationship between the pressure of the gas 106 and the power absorption frequency spectrum of the gas 106. The pressure of the gas 106 can thus be indicative of the resonant frequency of the gas 106 based on the known relationship between the pressure and the resonant frequency of the gas 106.

As an example, in response to a change in pressure of the gas 106, such as based on a change in temperature of the waveguide cavity 104, the gas 106 can change from exhibiting the power absorption frequency spectrum 702 to the power absorption frequency spectrum 704. The detection processor 116 can thus calculate the change in slope, and therefore the change in pressure, resulting in an identification of a change in the resonant frequency of the gas 106.

In the second power absorption frequency spectrum 804, the dither frequencies +$δ_1$ and −$δ_1$ provided during the first time duration each correspond to a portion of the power absorption frequency spectrum having a power $Pδ_1$ (e.g., $PWR_1=PWR_2=Pδ_1$). Therefore, during the first time duration, the dither frequency is provided as +$δ_1$ and −$δ_1$ to measure the respective powers $PWR_1$ and $PWR_2$ about the power $Pδ_1$. During the second time duration, the dither frequencies +$δ_2$ and −$δ_2$ each correspond to a portion of the power absorption frequency spectrum having a power $Pδ_2$ (e.g., $PWR_1=PWR_2=Pδ_2$). Therefore, during the second time duration, the dither frequency is provided as +$δ_2$ and −$δ_2$ to measure the respective powers $PWR_1$ and $PWR_2$ about the power $Pδ_2$.

Similar to as described above regarding the first power absorption frequency spectrum 802, the detection processor 116 can calculate the slope of the inverted peak 304. For example, the difference between the powers $Pδ_1$ and $Pδ_2$ and the difference between the relative offset frequencies $δ_1$ and $δ_2$ can be determinative of the slope of the inverted peak 304 in the second power absorption frequency spectrum 804. However, the detection processor 116 can identify a change in the slope between the first and second power absorption frequency spectrums 802 and 804. Particularly, the difference between the powers $Pδ_1$ and $Pδ_2$ is greater in the first power absorption frequency spectrum 802 relative to the difference between the powers $Pδ_1$ and $Pδ_2$ in the second power absorption frequency spectrum 804. Therefore, the detection processor 116 can monitor the change in slope of the inverted peak in each of the two time durations to calculate a change in the pressure of the gas 106.

As described above, the detection processor 116 provides the feedback signal FDBK to lock the center frequency to the resonant frequency of the gas 106. This continues to occur even when the resonant frequency of the gas 106 shifts based on changes in the pressure of the gas 106. However, based on identifying the change in pressure of the gas 106, and thus the amount of drift of the resonant frequency resulting from the change in pressure, the detection processor 116 is configured to mathematically compensate for the change in the resonant frequency in providing the stable frequency reference output signal $f_{OUT}$. For example, the detection processor 116 can change the denominator in the calculation of the downsampled frequency reference output signal $f_{OUT}$ to compensate for the change in the resonant frequency numerator in a proportional manner. Accordingly, the frequency reference output signal $f_{OUT}$ can be provided as a stable frequency reference, regardless of changes to the resonant frequency of the gas 106.

Figure 9:
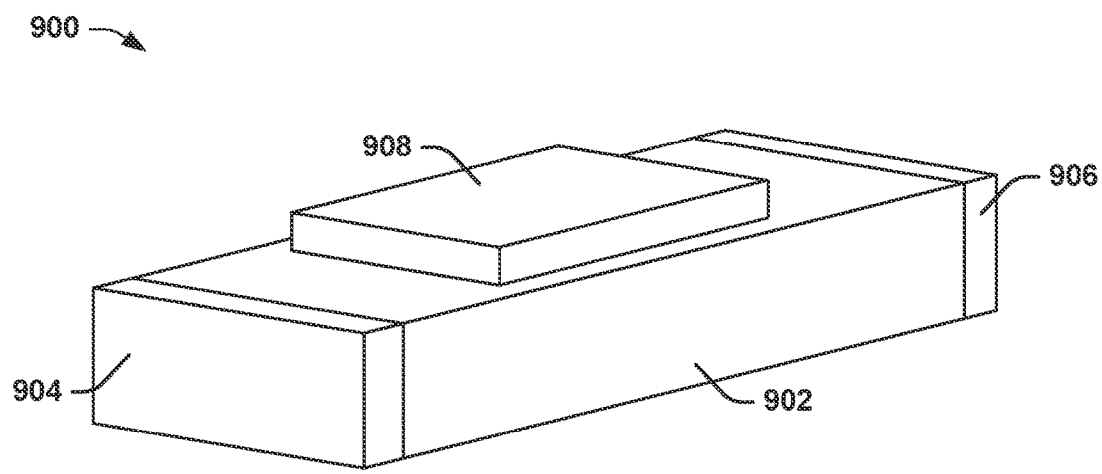
FIG. 9 illustrates an example of an integrated atomic clock system.

FIG. 9 illustrates an example of an integrated atomic clock system 900. The integrated atomic clock system 900 can correspond to the atomic clock system 100 in the example of FIG. 1. Therefore, reference is to be made to the example of FIG. 1 in the following description of the example of FIG. 9.

The integrated atomic clock system 900 can be fabricated in any of a variety of ways using integrated circuit fabrication techniques. The integrated atomic clock system 900 includes a waveguide cavity 902, as well as the transmit antenna 904 and the receive antenna 906 arranged on opposite ends of the waveguide cavity 902. The integrated atomic clock system 900 also includes a circuit portion 908 that includes the oscillator system 102 and the detection system 114. Microstrip lines or other RF signal carrying conductors can be routed between the circuit portion 908 and the antennas 904 and 906. Accordingly, the integrated atomic clock system 900 can be formed in an integrated package with a compact form-factor to provide a stable frequency reference, such as implemented in an INS or other precision device.

Figure 10:
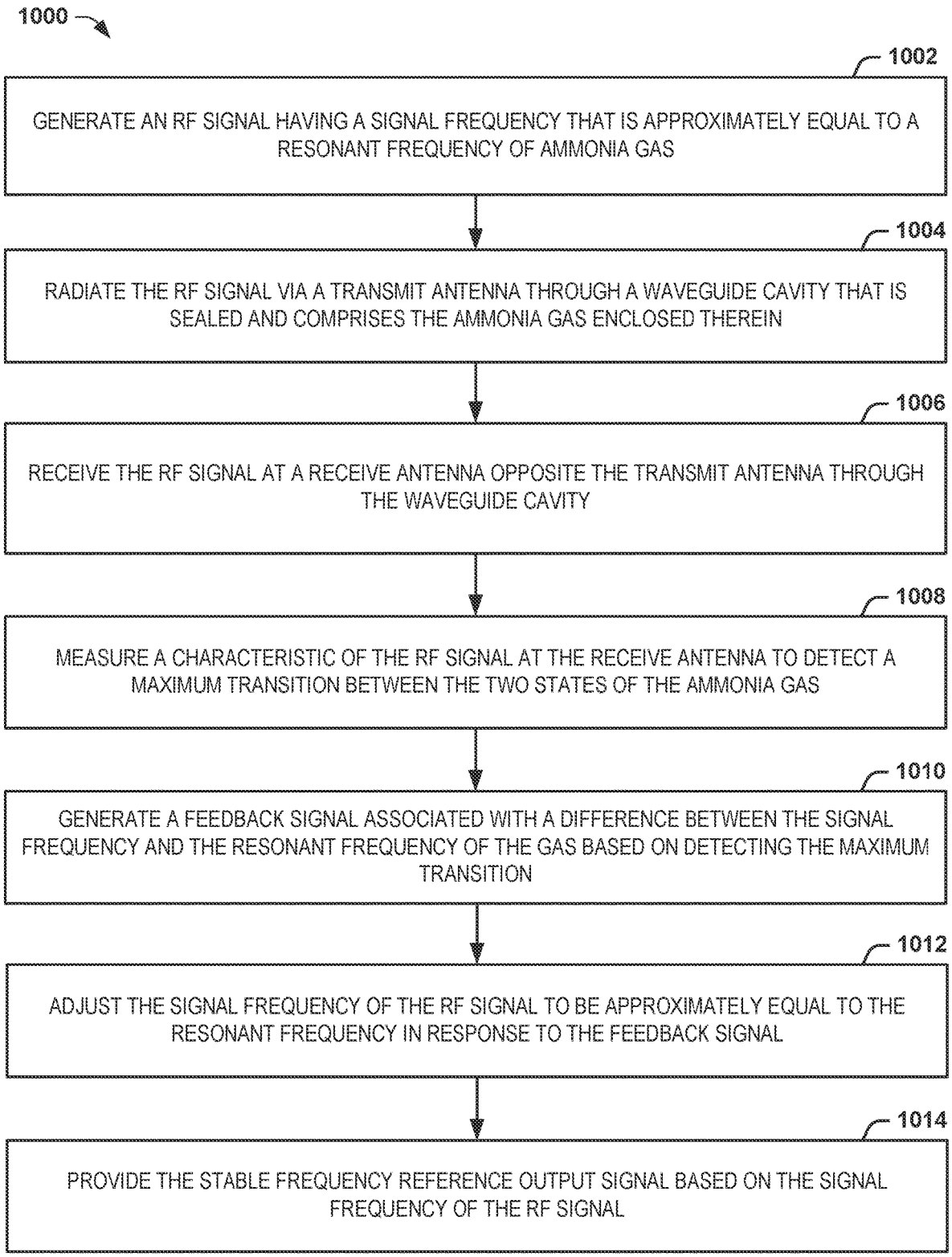
FIG. 10 illustrates an example of a method for providing a stable frequency reference output signal.

In view of the foregoing structural and functional features described above, a methodology in accordance with various aspects of the present invention will be better appreciated with reference to FIG. 10. While, for purposes of simplicity of explanation, the methodology of FIG. 10 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 10 illustrates an example of a method 1000 for providing a stable frequency reference output signal (e.g., the stable frequency reference output signal $f_{OUT}$). At 1002, an RF signal (e.g., the RF signal $f_{CTL}$) having a signal frequency that is approximately equal to a resonant frequency of ammonia gas is generated. At 1004, the RF signal is radiated via a transmit antenna (e.g., the transmit antenna 108) through a waveguide cavity (e.g., the waveguide cavity 104) that is sealed and comprises the ammonia gas enclosed therein. The waveguide cavity can have a length that is an integer multiple of approximately one half-wavelength of the resonant frequency of the ammonia gas between two states. At 1006, the RF signal is received at a receive antenna (e.g., the receive antenna 110) opposite the transmit antenna through the waveguide cavity. At 1008, a characteristic of the RF signal at the receive antenna is measured to detect a maximum transition between the two states of the ammonia gas. At 1010, a feedback signal (e.g., the feedback signal FDBK) associated with a difference between the signal frequency and the resonant frequency of the gas is generated based on detecting the maximum transition. At 1012, the signal frequency of the RF signal is adjusted to be approximately equal to the resonant frequency in response to the feedback signal. At 1014, the stable frequency reference output signal is generated based on the signal frequency of the RF signal.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An atomic clock system comprising:
a waveguide cavity that is sealed and comprises a gas enclosed therein, the waveguide cavity having a length that is an integer multiple of approximately one half-wavelength of a resonant frequency of the gas between two states;
an oscillator system configured to generate an RF signal through the waveguide cavity, wherein the oscillator system comprises a frequency controller that is configured to provide the RF signal as a dither signal between a first signal frequency and a second signal frequency, the RF signal having a center frequency between the first and second signal frequencies that is approximately equal to the resonant frequency of the gas; and
a detection system configured to measure a characteristic of the RF signal through the waveguide cavity to detect a maximum transition between the two states of the gas and to provide a feedback signal to the oscillator system to lock the center frequency of the RF signal to the resonant frequency of the gas based on detecting the maximum transition, the detection system being configured to provide a frequency reference output signal based on the center frequency of the RF signal.

2. The system of claim 1, wherein the gas is ammonia gas.

3. The system of claim 1, wherein the frequency controller is configured to provide the dither signal by adding a first offset frequency to the center frequency of the RF signal and by subtracting the first offset frequency from the center frequency of the RF signal at approximately equal time intervals to determine a difference between the center frequency of the RF signal and the resonant frequency of the gas, wherein the detection system comprises a detection processor configured to provide the feedback signal to adjust the center frequency to be approximately equal to the resonant frequency of the gas based on a difference in the measured characteristic between adding and subtracting the first offset frequency relative to the center frequency.

4. The system of claim 3, wherein the frequency controller is configured to provide the dither signal by adding and subtracting the first offset frequency relative to the center frequency during a first duration of time, and by adding and subtracting a second offset frequency relative to the center frequency during a second duration of time, wherein the second offset frequency is greater than the first offset frequency, wherein the detection processor is configured to determine the resonant frequency of the gas based on a time-averaged difference in the measured characteristic of the RF signal in each of the first and second durations of time and to adjust the frequency reference output signal based on the determined resonant frequency.

5. The system of claim 4, wherein the detection processor is configured to determine the resonant frequency of the gas based on identifying a pressure of the gas in the waveguide cavity in response to the time-averaged difference in the measured characteristic of the RF signal in each of the first and second durations of time.

6. The system of claim 1, wherein the waveguide cavity comprises a transmit antenna at a first end of the waveguide cavity and a receive antenna at a second end of the waveguide cavity opposite the first end, wherein the transmit antenna is configured to radiate the RF signal through the waveguide cavity to be received by the receive antenna, wherein the detection system comprises a stub tuner configured to provide reactive loading to the transmit antenna to adjust an electrical length of the waveguide cavity in response to a change of a physical length of the waveguide cavity.

7. The system of claim 6, wherein the waveguide cavity further comprises a temperature sensor configured to measure a temperature of the waveguide cavity, wherein the stub tuner is configured to adjust the electrical length of the waveguide cavity in response to the change of the physical length of the waveguide cavity based on the temperature.

8. The system of claim 6, wherein the oscillator system comprises a frequency controller that is configured to periodically sweep a frequency range between a first frequency and a second frequency on opposite sides of a power transmission peak of a power absorption frequency spectrum associated with the gas, wherein the stub tuner is configured to adjust the electrical length of the waveguide cavity in response to detecting the change of the physical length of the waveguide cavity in response to the periodic sweep of the frequency range.

9. An integrated circuit (IC) comprising the atomic clock system of claim 1.

10. A method for providing a stable frequency reference output signal, the method comprising:
    generating an RF signal having a center frequency that is approximately equal to a resonant frequency of ammonia gas, wherein generating the RF signal comprises:
        adding an offset frequency to the center frequency of the RF signal during a first time interval; and
        subtracting the offset frequency from the center frequency at a second time interval that is approximately equal to the first time interval;
    radiating the RF signal via a transmit antenna through a waveguide cavity that is sealed and comprises the ammonia gas enclosed therein, the waveguide cavity having a length that is an integer multiple of approximately one half-wavelength of the resonant frequency of the ammonia gas between two states;
    receiving the RF signal at a receive antenna opposite the transmit antenna through the waveguide cavity;
    measuring a characteristic of the RF signal at the receive antenna to detect a maximum transition between the two states of the ammonia gas;
    generating a feedback signal associated with a difference between the center frequency and the resonant frequency of the ammonia gas based on detecting the maximum transition;
    adjusting the center frequency of the RF signal to be approximately equal to the resonant frequency in response to the feedback signal; and
    providing the stable frequency reference output signal based on the center frequency of the RF signal.

11. The method of claim 10, wherein adding and subtracting the offset frequency relative to the center frequency comprises adding and subtracting a first offset frequency relative to the center frequency during a first duration of time, the method further comprising:
    adding a second offset frequency to the center frequency of the RF signal during a first time interval of a second duration of time;
    subtracting the second offset frequency from the center frequency at a second time interval that is approximately equal to the first time interval during the second duration of time, wherein the second offset frequency is greater than the first offset frequency;
    determining the resonant frequency of the ammonia gas based on a time-averaged difference in the measured characteristic of the RF signal in each of the first and second durations of time; and
    adjusting the stable frequency reference output signal based on the determined resonant frequency.

12. The method of claim 10, further comprising:
measuring a temperature of the waveguide cavity;
detecting a change in a physical length of the waveguide cavity based on the temperature; and
changing a reactive loading of the transmit antenna to adjust an electrical length of the waveguide cavity to be approximately equal to the physical length of the waveguide cavity.

13. The method of claim 10, further comprising:
periodically sweeping a signal frequency of the RF signal in a frequency range between a first frequency and a second frequency on opposite respective sides of a power transmission peak on a power absorption frequency spectrum associated with the ammonia gas;
detecting a change in a physical length of the waveguide cavity in response to the periodic sweep of the frequency range; and
changing a reactive loading of the transmit antenna to adjust an electrical length of the waveguide cavity to be approximately equal to the physical length of the waveguide cavity.

14. An integrated atomic clock system comprising:
a waveguide cavity that is sealed and comprises ammonia gas enclosed therein, the waveguide cavity having a length that is an integer multiple of approximately one half-wavelength of a resonant frequency of the ammonia gas between two states;
an oscillator system configured to generate an RF dither signal between a first signal frequency and a second signal frequency and to provide the RF dither signal through the waveguide cavity via a transmit antenna, the RF dither signal having a center frequency that is approximately equal to the resonant frequency of the ammonia gas; and
a detection system configured to measure a characteristic of the RF dither signal received at a receive antenna opposite the transmit antenna through the waveguide cavity in each of the first and second signal frequencies to detect a maximum transition between the two states of the ammonia gas and to provide a feedback signal to the oscillator system to lock the center frequency of the RF signal to the resonant frequency of the ammonia gas based on detecting the maximum transition, the detection system being configured to provide a frequency reference output signal based on the center frequency of the RF signal.

15. The system of claim 14, wherein the oscillator system comprises a frequency controller configured to provide the RF dither signal by adding a first offset frequency to the center frequency of the RF dither signal and by subtracting the first offset frequency from the center frequency of the RF dither signal at approximately equal time intervals to determine a difference between the center frequency of the RF dither signal and the resonant frequency of the ammonia gas, wherein the detection system comprises a detection processor configured to provide the feedback signal to adjust the center frequency to be approximately equal to the resonant frequency of the ammonia gas based on a difference in the measured characteristic between adding and subtracting the first offset frequency relative to the center frequency.

16. The system of claim 15, wherein the frequency controller is configured to provide the RF dither signal by adding and subtracting the first offset frequency relative to the center frequency during a first duration of time, and by adding and subtracting a second offset frequency relative to the center frequency during a second duration of time, wherein the second offset frequency is greater than the first offset frequency, wherein the detection processor is configured to determine the resonant frequency of the ammonia gas based on a time-averaged difference in the measured characteristic of the RF dither signal in each of the first and second durations of time and to adjust the frequency reference output signal based on the determined resonant frequency.

17. The system of claim 14, wherein the waveguide cavity further comprises a temperature sensor configured to measure a temperature of the waveguide cavity, wherein the detection system further comprises a stub tuner configured to adjust an electrical length of the waveguide cavity in response to the change of a physical length of the waveguide cavity based on the temperature.

18. The system of claim 14, wherein the oscillator system comprises a frequency controller that is configured to periodically sweep a frequency range between a first frequency and a second frequency on opposite sides of a power transmission peak on a power absorption frequency spectrum associated with the ammonia gas, wherein the detection system further comprises a stub tuner configured to adjust the electrical length of the waveguide cavity in response to detecting the change of the physical length of the waveguide cavity in response to the periodic sweep of the frequency range.

* * * * *